United States Patent
Chung

(10) Patent No.: US 11,555,829 B2
(45) Date of Patent: *Jan. 17, 2023

(54) PROBE MEMBER FOR POGO PIN, MANUFACTURING METHOD THEREFOR AND POGO PIN COMPRISING SAME

(71) Applicant: ISC CO., LTD., Seongnam-si (KR)

(72) Inventor: Young Bae Chung, Seongnam-si (KR)

(73) Assignee: ISC CO., LTD., Seongnam-si (KR)

( * ) Notice: Subject to any disclaimer, the term of this patent is extended or adjusted under 35 U.S.C. 154(b) by 417 days.

This patent is subject to a terminal disclaimer.

(21) Appl. No.: 16/627,237

(22) PCT Filed: Jun. 22, 2018

(86) PCT No.: PCT/KR2018/007084
§ 371 (c)(1),
(2) Date: Dec. 27, 2019

(87) PCT Pub. No.: WO2019/004661
PCT Pub. Date: Jan. 3, 2019

(65) Prior Publication Data
US 2020/0182905 A1    Jun. 11, 2020

(30) Foreign Application Priority Data
Jun. 28, 2017 (KR) .................. 10-2017-0081741

(51) Int. Cl.
*G01R 1/067* (2006.01)
(52) U.S. Cl.
CPC ................ *G01R 1/06722* (2013.01)

(58) Field of Classification Search
CPC  H01R 13/7195; H01R 13/426; H01R 13/521; H01R 13/5224; H01R 13/719; G01N 29/2406
(Continued)

(56) References Cited

U.S. PATENT DOCUMENTS 9,726,693 B2    8/2017  Lee
2004/0239355 A1* 12/2004 Kazama ............... H01R 13/03
                                                    324/755.05
(Continued)

FOREIGN PATENT DOCUMENTS

JP    2009198238    *  3/2011 ............ H01L 29/78
JP    2013-529789 A    7/2013
(Continued)

OTHER PUBLICATIONS

KIPO; Application No. PCT/KR2018/007084; International Search Report dated Sep. 14, 2018.
(Continued)

*Primary Examiner* — Melissa J Koval
*Assistant Examiner* — Trung Q Nguyen
(74) *Attorney, Agent, or Firm* — Fitch, Even, Tabin & Flannery LLP

(57) ABSTRACT

The present invention relates to a probe member for a pogo pin, a method of manufacturing the probe member, and a pogo pin including the probe member. An embodiment of the present invention provides a probe member including a first body portion and a second body portion that are stacked in a height direction based on the other end of a contact portion, wherein the probe member is used in a test socket in a state in which at least a portion of the probe member is inserted in a pipe having an internal space.

13 Claims, 13 Drawing Sheets

(58) Field of Classification Search
USPC ........ 324/500, 756.05–758.1, 754.1, 754.07, 324/754.24, 755.1, 754.03, 754.14, 324/756.03, 724, 437, 445, 446
See application file for complete search history.

(56) References Cited

U.S. PATENT DOCUMENTS

| | | |
|---|---|---|
| 2008/0061809 A1 | 3/2008 | Lee et al. |
| 2013/0099811 A1* | 4/2013 | Lee .................. G01R 1/06722 324/754.11 |
| 2013/0106457 A1 | 5/2013 | Lee |

FOREIGN PATENT DOCUMENTS

| | | |
|---|---|---|
| KR | 10-2008-0023028 A | 3/2008 |
| KR | 10-2011-0002962 A | 1/2011 |
| KR | 10-1047550 B1 | 7/2011 |
| KR | 10-2013-0124824 A | 11/2013 |
| KR | 10-1439342 B1 | 9/2014 |
| TW | M457183 U1 | 7/2013 |
| TW | 201605128 A | 2/2016 |
| TW | I574015 B | 3/2017 |

OTHER PUBLICATIONS

TIPO; Application No. 10820403160; Office Action dated May 2, 2019.

* cited by examiner (a)  (b)

PROBE MEMBER FOR POGO PIN, MANUFACTURING METHOD THEREFOR AND POGO PIN COMPRISING SAME

CROSS-REFERENCE TO RELATED APPLICATIONS

This application is a U.S. national phase application filed under 35 U.S.C. § 371 of International Application No. PCT/KR2018/007084, filed Jun. 22, 2018, designating the United States, which claims priority from Korean Application Number 10-2017-0081741, filed Jun. 28, 2017.

FIELD OF THE INVENTION

The present invention relates to a probe member for a pogo pin, a method of manufacturing the probe member, and a pogo pin including the probe member, and more particularly, to a probe member for a pogo pin, having improved conductivity and wear resistance, a method of manufacturing the probe member, and a pogo pin including the probe member.

BACKGROUND OF THE INVENTION

After manufacturing processes, semiconductor devices are electrically inspected to check whether the semiconductor devices are normally operable or reliable. In such inspection processes, test devices including pads, and test sockets are used.
Test sockets are used to connect terminals of semiconductor devices to pads of test devices such that electrical signals may be exchanged between the terminals of the semiconductor devices and the test devices.

To this end, pogo pins are arranged in such a test socket as a contact means. Pogo pins include probe members and elastic members to guarantee smooth contact between a semiconductor device and a test device and absorb mechanical shocks that may occur when the semiconductor device and the test device are brought into contact with each other.

FIG. 1 is a view schematically illustrating a pogo pin of the related art. As shown in FIG. 1, an upper plunger 1005 and a lower plunger 1006 protrude from both ends of a body 1004 of the pogo pin, and a spring 7 is inserted in the body 1004. The upper and lower plungers 1005 and 1006 are biased by the spring 1007 in directions away from each other. In this state, the upper plunger 1005 is brought into contact with a terminal 1002 of a semiconductor device 1001, and the lower plunger 1006 is brought into contact with a pad 1009 of a test device 1008 such that the terminal 1002 of the semiconductor device 1001 may be electrically connected to the pad 1009 of the test device 1008.

Another pogo pin of the related art is disclosed in Korean Patent No. 10-1439342. Specifically, referring to FIGS. 2 and 3, the pogo pin includes a probe member 1110, a body 1120, an elastic member 1130 in the body 1120 to bias the probe member 1110 in an upward direction, and a lower probe member 1140 at least partially exposed through a lower opening of the body 1120 and supported by the elastic member 1130, wherein the probe member 1110 includes a plurality of probe plates 1112 to 1116 integrally attached to each other and including probe portions 1112a to 1114a and coupling portions 1112b to 1114b.

However, such pogo pins of the related art have the following problems.

Since probe portions to be brought directly into contact with a terminal of a semiconductor device have a plate form, the contact area between the terminal of the semiconductor device and the probe portions is limited.

In addition, although the probe portions are required to have high wear resistance to endure a concentrative load applied by the semiconductor device, and coupling portions are required to have high conductivity to compensate for conductivity loss at the coupling portions, since the probe portions of the related art are horizontally stacked with respect to a contact portion, the probe portions and the coupling portions do not sufficiently exhibit their characteristic electrical and mechanical properties even when formed of different materials. That is, in the related art, wear resistance and conductivity required for pogo pins are poorly guaranteed.

SUMMARY OF THE INVENTION

A technical problem of the present invention is to provide a probe member for a pogo pin in which contact and body portions of the probe member are stacked in a vertical direction based on a contact region with a terminal to improve wear resistance and conductivity of the probe member, a method of manufacturing the probe member, and a pogo pin including the probe member.

However, aspects of the present invention are not limited thereto. Additional aspects will be set forth in part in the description which follows, and will be apparent from the description to those of ordinary skill in the art to which the present invention pertains.

Additional aspects will be set forth in part in the description which follows and, in part, will be apparent from the description, or may be learned by practice of the presented embodiments.

To solve the technical problem, an embodiment of the present invention provides a probe member including: at least one contact portion having a pointed tip on one end and configured to be brought into contact with a terminal of a test-target object; a first body portion having a polygonal or circular pillar shape, the other end of the contact portion being coupled to one end of the first body portion; and a second body portion having a polygonal or circular pillar shape, the other end of the first body portion being coupled to one end of the second body portion, wherein the first body portion and the second body portion are stacked in a height direction based on the other end of the at least one contact portion, wherein the probe member is used in a test socket in a state in which the probe member is at least partially inserted in a pipe having an internal space.

In an embodiment of the present invention, the probe member may further include a third body portion having a polygonal or circular pillar shape, the other end of the second body portion being coupled to one end of the third body portion.

In an embodiment of the present invention, the second body portion may have an outer diameter less than respective outer diameters of the first and third body portions, such that a recessed portion of the pipe may be fixed to at least a portion of an outer peripheral surface of the second body portion or such that an elastic member in the internal space of the pipe may be fixed to at least a portion of the second body portion.

In an embodiment of the present invention, the probe member may further include a fourth body portion having a polygonal or circular pillar shape, the other end of the third body portion being connected to one end of the fourth body portion.

In an embodiment of the present invention, the third body portion may have an outer diameter less than respective outer diameters of the second and fourth body portions, such that a recessed portion of the pipe may be fixed to at least a portion of an outer peripheral surface of the third body portion or such that an elastic member in the internal space of the pipe may be fixed to at least a portion of the third body portion.

In an embodiment of the present invention, the probe member may further include at least one additional body portion on the other end of the fourth body portion. In an embodiment of the present invention, the at least one contact portion may have a cross-sectional area which gradually increases or is constant in a direction from the one end toward the other end of at least one contact portion.

In an embodiment of the present invention, the at least one contact portion is two or more in number, and at least one of the two or more contact portions may have a height different from that of the other contact portions.

In an embodiment of the present invention, the at least one contact portion may have a quadrangular pyramid shape, and lateral surfaces of the quadrangular pyramid shape may each have an equilateral triangle shape with an apex angle of 50° to 90°.

In an embodiment of the present invention, the at least one contact portion may have a height of 650 µm or less.

In an embodiment of the present invention, the at least one contact portion may be two or more in number, and a distance between adjacent contact portions may be 15 µm or greater.

To solve the technical problem, an embodiment of the present invention provides a method of manufacturing a probe member for a pogo pin used in a test socket, the probe member being configured to be at least partially inserted in a pipe having an internal space, the method including: forming, in a sacrificial substrate, at least one first hole having a pointed tip on one end; forming a contact portion by filling a first stacking material in the at least one first hole and leveling the first stacking material; placing a first dry film on an upper surface of the sacrificial substrate and forming, in the first dry film, a second hole having a polygonal or circular pillar shape to expose the contact portion; forming a first body portion by filling a second stacking material in the second hole and leveling the second stacking material; placing a second dry film on an upper surface of the first dry film and forming, in the second dry film, a third hole having a polygonal or circular pillar shape to expose a least a portion of the first body portion; and forming a second body portion by filling a third stacking material in the third hole and leveling the third stacking material, wherein the first and second dry films are stacked in a height direction based on the upper surface of the sacrificial substrate in which the at least one first hole is formed.

In an embodiment of the present invention, the method may further include: placing a third dry film on an upper surface of the second dry film and forming, in the third dry film, a fourth hole having a polygonal or circular pillar shape to expose the second body portion; and forming a third body portion by filling a fourth stacking material in the fourth hole and leveling the fourth stacking material.

In an embodiment of the present invention, the third hole may have an area less than respective areas of the second hole and the fourth hole.

In an embodiment of the present invention, the method may further include: placing a fourth dry film on an upper surface of the third dry film and forming, in the fourth dry film, a fifth hole having a polygonal or circular pillar shape to expose the third body portion; and forming a fourth body portion by filling a fifth stacking material in the fifth hole and leveling the fifth stacking material.

In an embodiment of the present invention, the fourth hole may have an area less than respective areas of the third hole and the fifth hole.

In an embodiment of the present invention, the at least one first hole may have a quadrangular pyramid shape, and lateral surfaces of the quadrangular pyramid shape may each have an equilateral triangle shape with an apex angle of 50° to 90°.

To solve the technical problem, an embodiment of the present invention provides a pogo pin configured to be brought into contact with a terminal of a semiconductor device for inspecting electrical characteristics of the semiconductor device, the pogo pin including: the probe member; a pipe in which an internal space is formed to accommodate a portion of the probe member; a plunger having a portion inserted in the internal space and another portion protruding outward from the pipe; and an elastic member having one end coupled to the probe member to bias the probe member toward an outside of the pipe, and having the other end coupled to the plunger.

According to the embodiments of the present invention, the at least one contact portion and the body portions of the probe member for a pogo pin may be vertically stacked based on a contact region with a terminal, the at least one contact portion may include a high-hardness material, and the body portions may include a highly conductive material, thereby increasing efficiency and a lifespan of the probe member.

Effects of the present invention are not limited to the above-described effects but include all effects that may be inferred from the detailed description of the present invention or the constitution of the present invention defined by the claims.

DETAILED DESCRIPTION OF THE PREFERRED EMBODIMENTS

Figure 1:
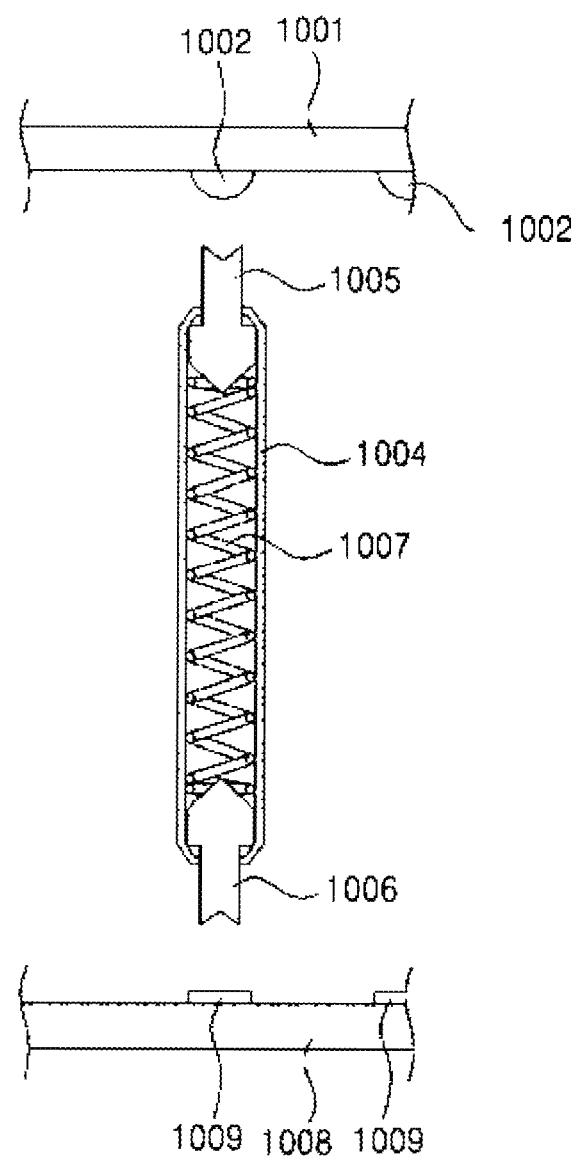
FIG. 1 is a schematic view illustrating a pogo pin of the related art.

The present invention will now be described with reference to the accompanying drawings. However, the present invention may be variously implemented. Thus, the present invention should not be considered as being limited to embodiments described below. In the drawings, parts not relevant to the present invention may be omitted for clarity of illustration, and like reference numerals refer to like elements throughout.

In the present specification, when a portion is referred to as being "connected to (jointed to, brought into contact with, or coupled to)" another portion, it may be directly connected to the other portion or intervening portions may be present. In addition, it will be further understood that the terms "comprises" and/or "comprising" used herein specify the presence of stated elements, but do not preclude the presence or addition of one or more other elements unless the context clearly indicates otherwise.

In the following description, technical terms are used only for explaining specific embodiments while not limiting the scope and spirit of the present invention. As used herein, the singular forms "a," "an" and "the" are intended to include the plural forms as well, unless the context clearly indicates otherwise. The meaning of 'include' or 'comprise' specifies a property, a fixed number, a step, a process, an element, a component, or a combination thereof but does not exclude other properties, fixed numbers, steps, processes, elements, components, or combinations thereof.

Hereinafter, embodiments of the present invention will be described with reference to the accompanying drawings.

Figure 4:
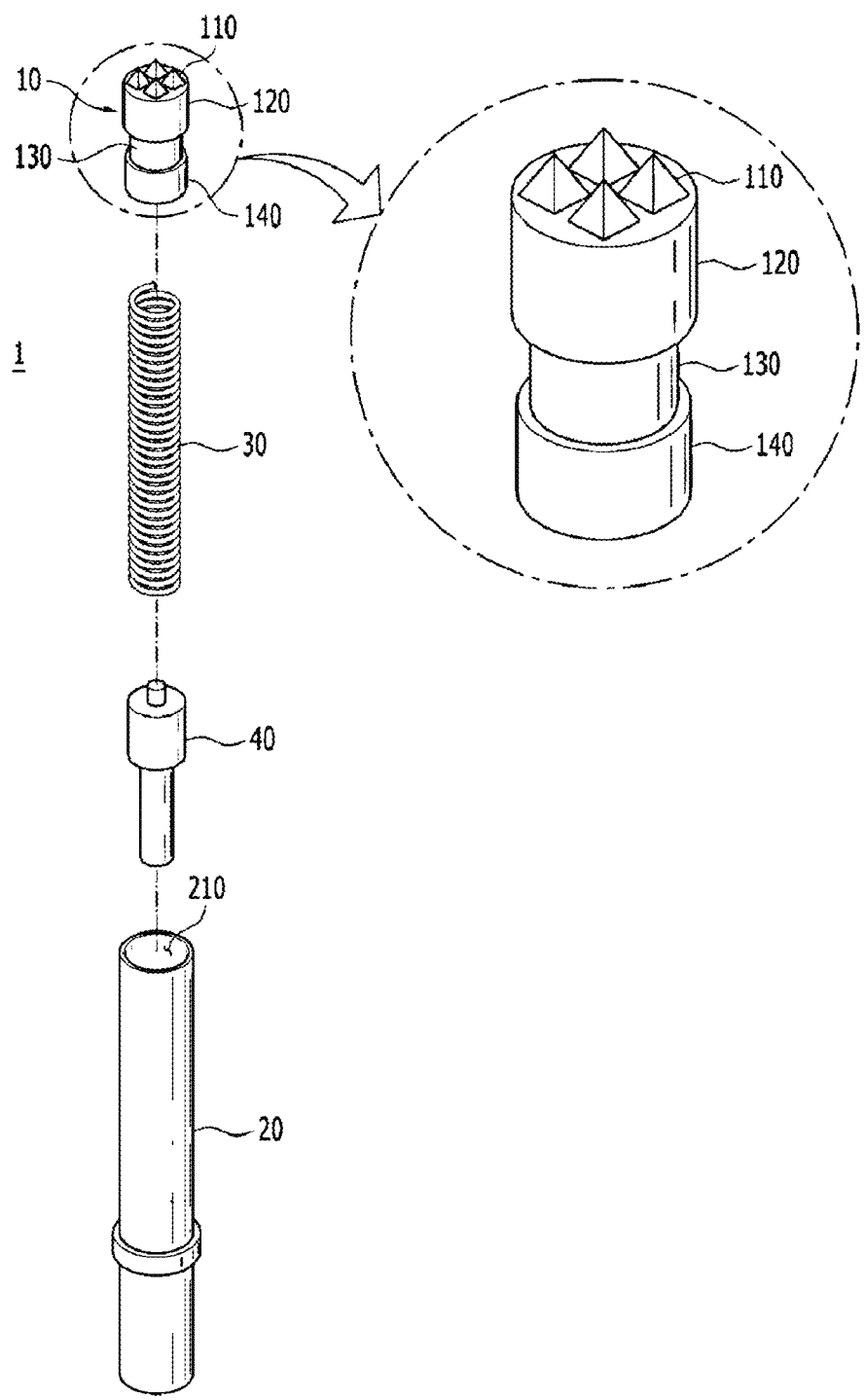
FIG. 4 is an exploded perspective view illustrating a pogo pin including a probe member, according to a first embodiment of the present invention.
Figure 5:
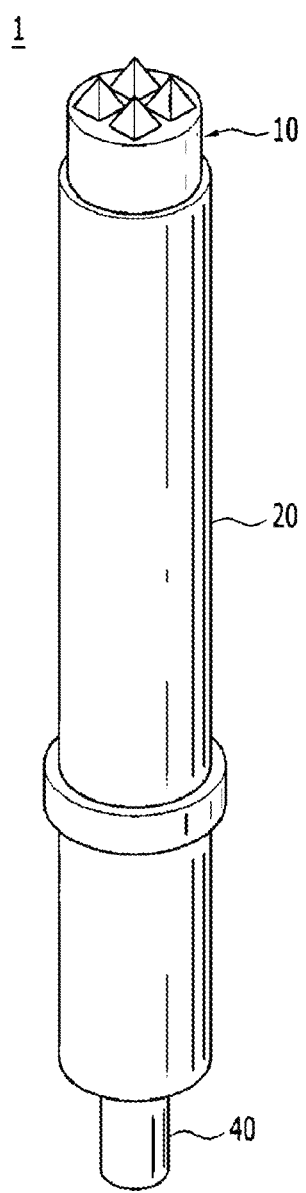
FIG. 5 is a perspective view illustrating the pogo pin including the probe member, according to the first embodiment of the present invention.

FIG. 4 is an exploded perspective view illustrating a pogo pin 1 including a probe member 10 for a pogo pin according to a first embodiment, and FIG. 5 is a perspective view illustrating the pogo pin 1 including the probe member 10 for a pogo pin according to the first embodiment.

The pogo pin 1 is an element provided to a test socket (not shown) to connect a semiconductor device B (refer to FIG. 10) to a test device (not shown), and a pipe 20 (described later) of the pogo pin 1 may be coupled to the test socket.

The pogo pin 1 including the probe member 10 for a pogo pin (hereinafter referred to as the probe member 10) includes: the pipe 20 having a polygonal or circular pillar shape in which an internal space 210 is longitudinally formed with openings communicating with the internal space 210 at one end and the other end to receive the probe member 10; the probe member 10 having at least a portion placed in the internal space 210 of the pipe 20 and the other portion protruding outward through the opening at the one end; a plunger 40 having at least a portion placed in the internal space 210 of the pipe 20 and the other portion protruding outward through the opening at the other end; and an elastic member 30 placed in the internal space 210 of the pipe 20 to bias the probe member 10 or the plunger 40 in an outward direction. In this case, the pipe 20 forms the basic outer shape of the probe member 10 and may be called a barrel or housing, and the internal space 210 may have a circular pillar shape.

Figure 10:
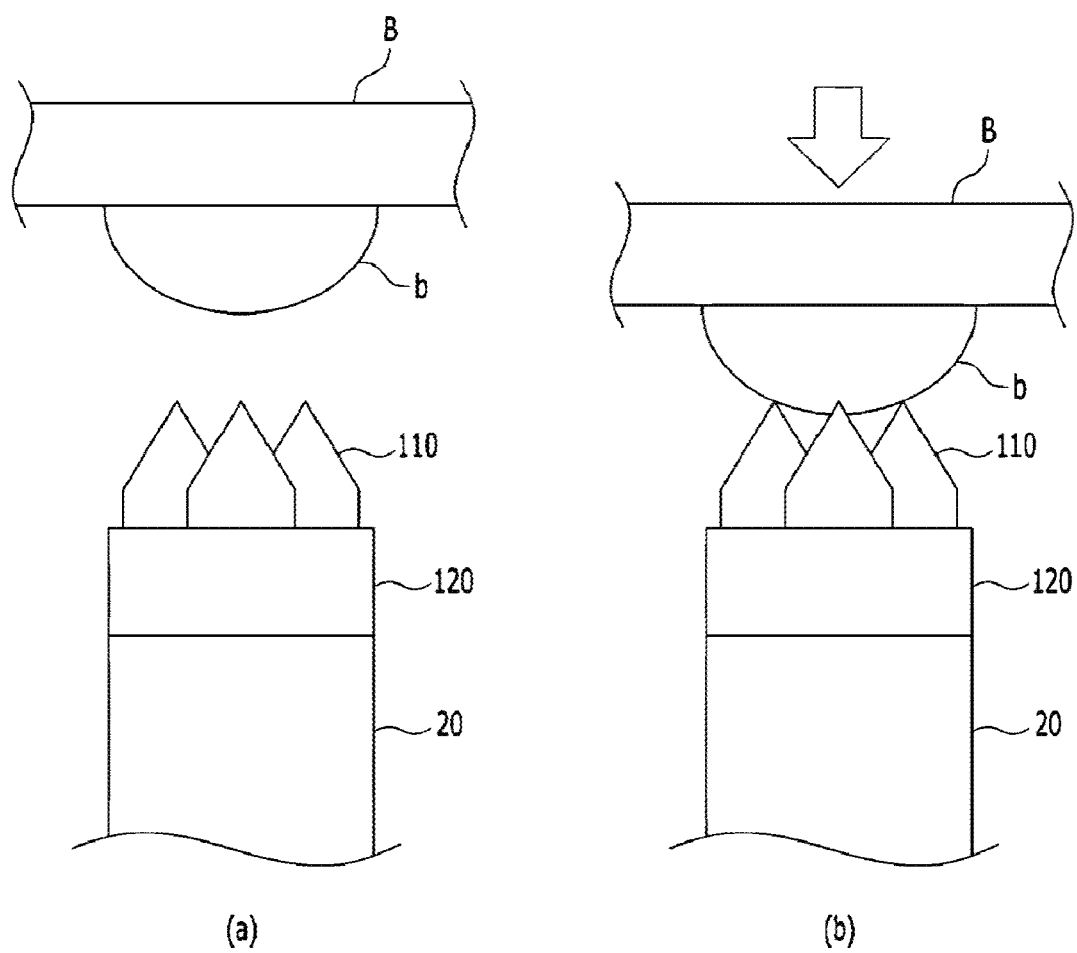
FIG. 10 illustrates operational views of the pogo pin including the probe member, according to the first embodiment of the present invention.

The probe member 10 may be used to inspect electrical characteristics of the semiconductor device B (refer to FIG. 10). As described above, at least a portion of the probe member 10 may be inserted in the internal space 210 of the pipe 20, and the other portion of the probe member 10 may protrude outward through the opening at the one end for contact with a terminal (b) (refer to FIG. 10) of the semiconductor device B.

The probe member 10 includes: a plurality of contact portions 110 each having a pointed tip on one end and capable of making contact with the terminal (b) of the semiconductor device B; a first body portion 120 having a polygonal or circular pillar shape, one end of the first body portion 120 being coupled to the other ends of the plurality of contact portions 110; and a second body portion 130 having a polygonal or circular pillar shape, one end of the second body portion 130 being coupled to the other end of the first body portion 120. That is, the first body portion 120 and the second body portion 130 are sequentially stacked on the other ends of the contact portions 110 in a height direction. In other words, the contact portions 110, the first body portion 120, and the second body portion 130 are stacked in a vertical direction based on a region to be brought into contact with the terminal (b) of the semiconductor device B. Here, the height direction refers to a direction going away from the other ends of the contact portions 110, and the vertical direction refers to a direction perpendicular to a surface of the semiconductor device B on which the terminal (b) is formed.

Figure 2:
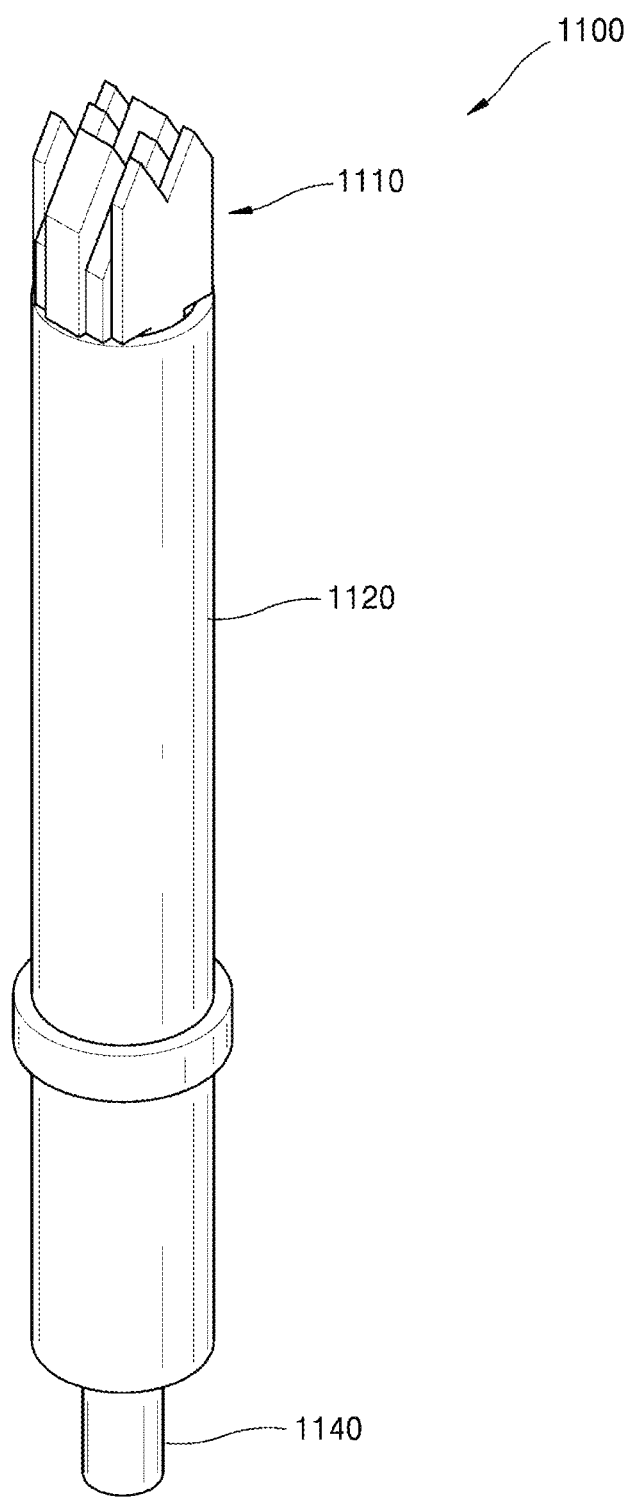
FIG. 2 is a perspective view illustrating another pogo pin of the related art.
Figure 3:
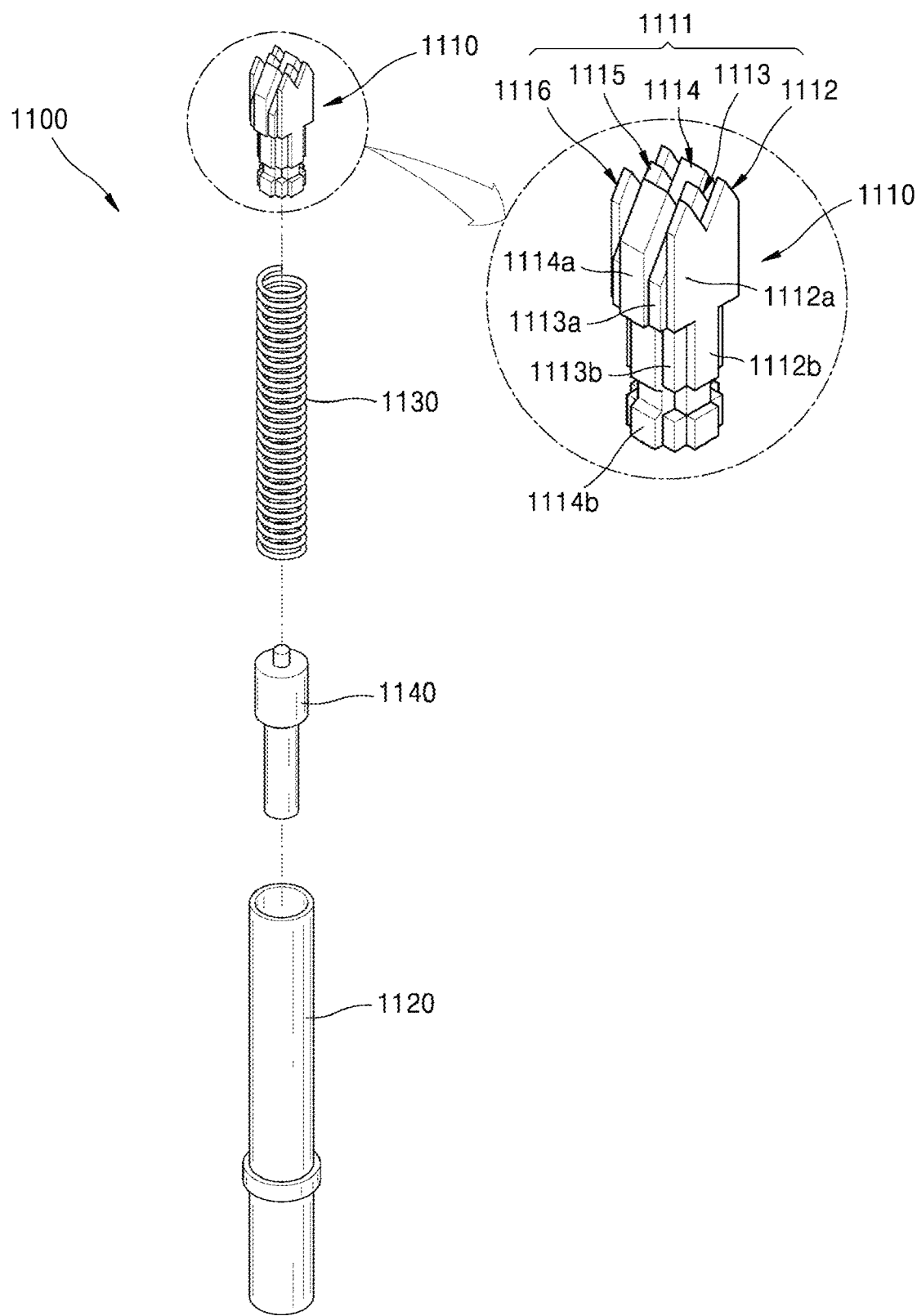
FIG. 3 is an exploded perspective view illustrating the pogo pin of the related art shown in FIG. 2.

Since the contact portions 110 and the first and second body portions 120 and 130 are vertically stacked in the probe member 10 of the present invention, the probe member 10 may have improved structural stability and contact characteristics compared to the probe member 1110 of the related art having a plate shape as shown in FIG. 2.

The contact portions 110 may have a cross-sectional area gradually increasing in a direction from the one ends toward the other ends of the contact portions 110. FIGS. 4 and 5 illustrate the contact portions 110 having a quadrangular pyramid shape. The contact portions 110 having a quadrangular pyramid shape may make contact with the terminal (b) of the semiconductor device B at central apexes of the contact portions 110, and bottom surfaces of the contact portions 110 may be coupled to the one end of the first body portion 120.

In addition, at least one of two or more contact portions 110 may have a height different from the height of the other contact portions 110. For example, at least one contact portion 110 may include a material having higher hardness than the other contact portions 110 and may be higher than the other contact portions 110. When the at least one contact portion 110 having higher hardness makes contact with the terminal (b) of the semiconductor device B earlier than the other contact portions 110, the at least one contact portion 110 removes foreign substances on the terminal (b) or breaks an oxide layer formed on the surface of the terminal (b), and then the other contact portions 110 makes contact with the terminal (b), thereby guaranteeing effective electrical conduction.

In addition, as described above, at least one of the contact portions 110 may include a material different from a material included in the other contact portions 110. For example, at least one contact portion 110 may have a high-hardness material including a nickel alloy, and the other contact portions 110 may have a metallic material having high conductivity such as gold or silver. At least one contact portion 110 containing a high-hardness material may have a function of breaking an oxide layer formed on the surface of the terminal (b), and the other contact portions 110 may provide high conductivity.

FIGS. 4 and 5 illustrate the probe member 10 in the case where the probe member 10 has four (2×2) contact portions 110. However, the probe member 10 may have nine (3×3) contact portions 110 or another number of contact portions 110 without limitations.

In an embodiment of the present invention, the probe member 10 may further include a third body portion 140. The third body portion 140 may have a polygonal or circular pillar shape, and the other end of the second body portion 130 may be coupled to one end of the third body portion 140. The third body portion 140 may be stacked together with the first and second body portions 120 and 130 in the height direction based on the other ends of the contact portions 110.

Figure 6:
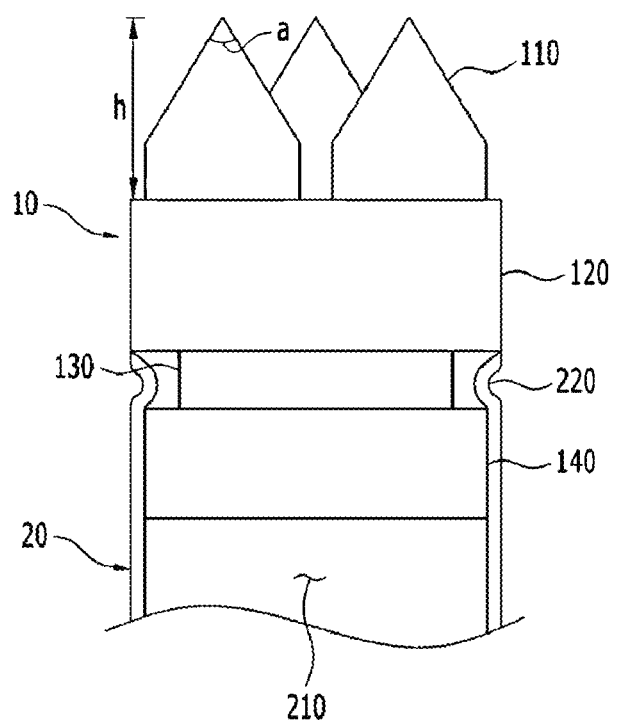
FIG. 6 is a cross-sectional view illustrating the probe member inserted into a pipe, according to the first embodiment of the present invention.

FIG. 6 is a cross-sectional view illustrating the probe member 10 inserted in the pipe 20 according to the first embodiment of the present invention.

According to the embodiment of the present invention, regions of the contact portions 110 including the one ends of the contact portions 110 directly making contact with the terminal (b) of the semiconductor device B may have cross-sectional areas increasing in a direction from the one ends toward the other ends of the contact portions 110, and the other regions of the contact portions 110 including the other ends of the contact portions 110 directly in contact with the one end of the first body portion 120 may have a polygonal or circular pillar shape.

In the contact portions 110 shown in FIG. 6, the regions including the one ends of the contact portions 110 directly making contact with the terminal (b) have a quadrangular pyramid shape, and the other regions of the contact portions 110 including the other ends contacting the one end of the first body portion 120 have a hexahedral shape.

The first body portion 120 may have a cross-sectional area greater than the cross-sectional area of the internal space 210. In this case, the probe member 10 may not be completely inserted into the pipe 20 because of the first body portion 120.

In addition, the second body portion 130 may have a cross-sectional area less than the cross-sectional areas of the first body portion 120, the second body portion 130, and the internal space 210. In this case, a region of the pipe 20 corresponding to the second body portion 130 may be pressed to form a recessed portion 220 and thus to fix the probe member 10 to the pipe 20 by the recessed portion 220.

In more detail, since the cross-sectional area of the internal space 210 in the region in which the recessed portion 220 is formed is less than the cross-sectional areas of the first body portion 120 and the third body portion 140, the recessed portion 220 is caught between the first body portion 120 and the third body portion 140, and thus relative movement between the probe member 10 and the pipe 20 may be suppressed or limited.

In this case, the cross-sectional area of the third body portion 140 may be less than or equal to the cross-sectional area of the internal space 210 such that the third body portion 140 may be inserted into the internal space 210. If the cross-sectional area of the third body portion 140 is equal to the cross-sectional area of the internal space 210, the third body portion 140 may be fitted into the internal space 210.

That is, the probe member 10 and the pipe 20 may be primarily coupled to each other by fitting the third body portion 140, and may be secondarily coupled to each other by forming the recessed portion 220.

The contact portions 110 or the regions of the contact portions 110 having a quadrangular pyramid shape may have lateral surfaces having the shape of an equilateral triangle, and the apex angle (a) of the equilateral triangle may be within the range of 50° to 90°. If the apex angle (a) of the equilateral triangle is less than 50°, the contact portions 110 may be poorly durable and structurally unstable. Conversely, if the apex angle (a) of the equilateral triangle is greater than 90°, the contact portions 110 may make poor contact with the terminal (b).

Figure 7:
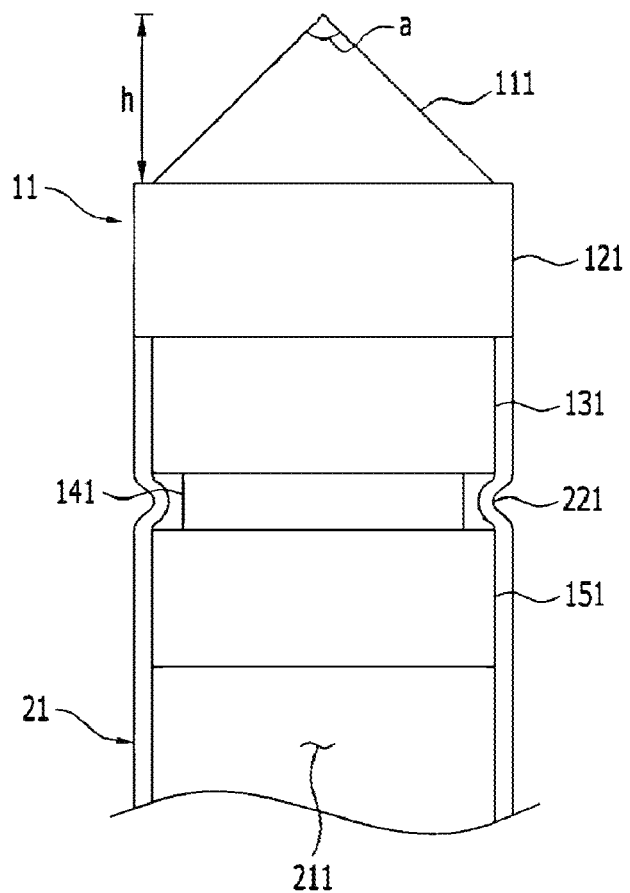
FIG. 7 is a cross-sectional view illustrating a probe member for a pogo pin, according to a second embodiment of the present invention, the probe member being inserted into a pipe.

In addition, the contact portions 110 may have a height (h) of 650 μm or less from the one ends to the other ends thereof. If the height (h) of the contact portions 110 is greater than 650 μm, excessive current loss may occur in the contact portions 110. FIG. 7 is a cross-sectional view illustrating a probe member 11 inserted in a pipe 21 according to a second embodiment of the present invention.

The second embodiment may employ technical features of the first embodiment, and features different from those of the first embodiment will now be mainly described. Unlike the probe member 10 of the first embodiment, the probe member 11 of the second embodiment has one contact portion 111, and the contact portion 111 may have a cross-sectional area gradually increasing in a direction from one end toward the other end of the contact portion 111. In the present invention, the number of contact portions 111 may vary with user's designs.

According to the second embodiment of the present invention, the probe member 11 may further include a fourth body portion 151. The fourth body portion 151 may have a polygonal or circular pillar shape, and the other end of a third body portion 141 may be coupled to one end of the fourth body portion 151. The fourth body portion 151 may be sequentially stacked together with the other body portions 121, 131, and 141 in a height direction based on the other end of the contact portion 111.

The third body portion 141 may have a cross-sectional area less than the cross-sectional areas of a second body portion 131, the fourth body portion 151, and an internal space 211. In this case, a region of the pipe 21 corresponding to the third body portion 141 may be pressed to form a recessed portion 221 and thus to fix the probe member 11 to the pipe 21 by the recessed portion 221. In more detail, since the cross-sectional area of the internal space 211 in the region in which the recessed portion 221 is formed is less than the cross-sectional areas of the second body portion 131 and the fourth body portion 151, the recessed portion 221 of the pipe 21 is caught between the second body portion 131 and the fourth body portion 151, and thus relative movement between the probe member 11 and the pipe 21 may be suppressed or limited. In this case, the cross-sectional area of the fourth body portion 151 may be less than or equal to the cross-sectional area of the internal space 211 such that the fourth body portion 151 may be inserted into the internal space 211. In an embodiment of the present invention, the cross-sectional area of the second body portion 131 may also be less than or equal to the cross-sectional area of the internal space 211 such that the second body portion 131 may be inserted into the pipe 21.

In addition, if the cross-sectional area of the second body portion 131 or the fourth body portion 151 is equal to the cross-sectional area of the internal space 211, the second body portion 131 or the fourth body portion 151 may be fitted into the internal space 210. That is, the probe member 11 and the pipe 21 may be primarily coupled to each other by fitting the second body portion 131 or the fourth body portion 151, and may be secondarily coupled to each other by forming the recessed portion 221. The probe member 11 may further include an addition body portion in addition to the first to fourth body portions 121 to 151. The additional body portion may also be sequentially stacked together with the other body portions 121 to 151 in the height direction based on the other end of the contact portion 110.

As described above, in the probe members 10 and 11, the body portions may have different cross-sectional areas to easily form a multi-step structure, and thus the probe members 10 and 11 may be easily coupled to the pipes 20 and 21.

In addition, the body portions of the probe members 10 and 110 to be inserted into the pipes 20 and 21 may have a circular pillar shape, and may thus be easily inserted into the pipes 20 and 21 having a circular pillar shape.

Figure 8:
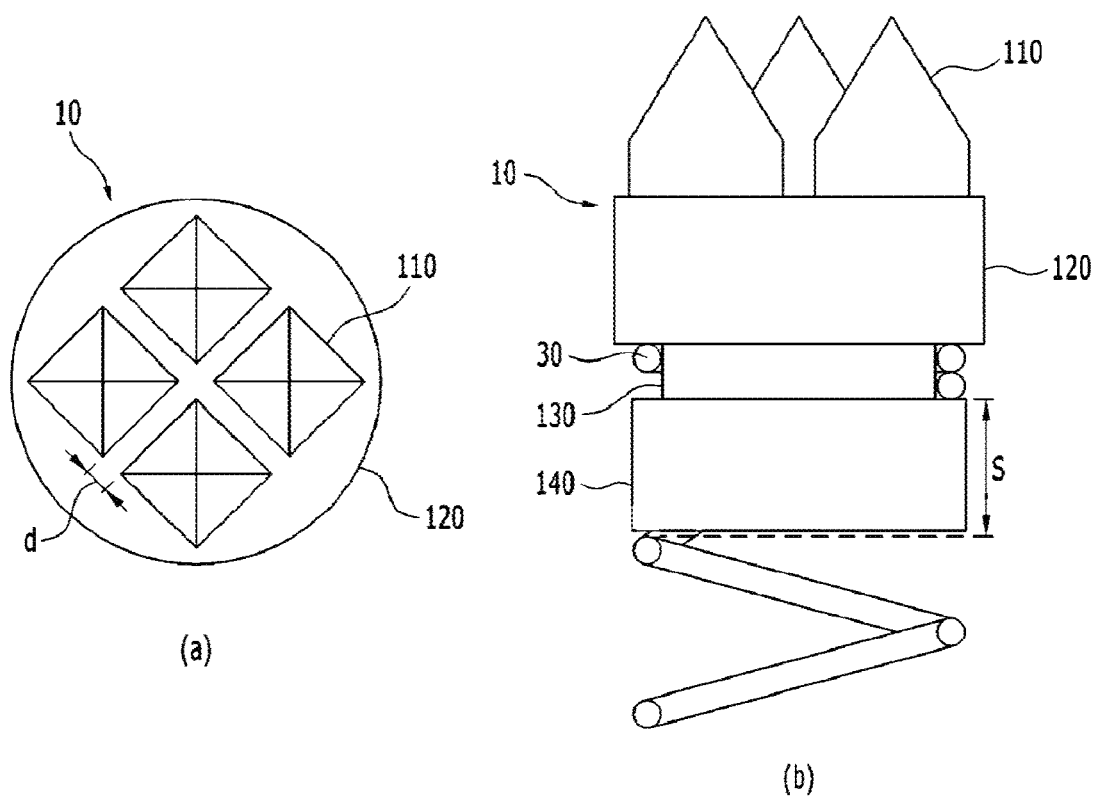
FIG. 8 illustrates a front view and a cross-sectional view of the probe member for a pogo pin of the first embodiment of the present invention, the probe member being connected to an elastic member.

FIG. 8 illustrates a front view and a cross-sectional view of the probe member 10 coupled to the elastic member 30 according to the first embodiment of the present invention. FIG. 8(a) illustrates the front view of the probe member 10.

In the probe member 10 of the first embodiment of the present invention, the four contact portions 110 are coupled to the one end of the first body portion 120 in such a manner that the four contact portions 110 are spaced apart from each other. In this case, the distance (d) between adjacent contact portions 110 may be 15 μm or greater. If the distance (d) between adjacent contact portions 110 is less than 15 μm, the adjacent contact portions 110 may interfere with each other.

FIG. 8(b) illustrates the cross-sectional view of the probe member 10. The elastic member 30 is provided to resist against compressing force. That is, the elastic member 30 includes a plurality of circular turns connected to each other, and in a load-free state, the circular turns connected to each other has a gap (s) therebetween.

The second body portion 130 may have a cross-sectional area less than or equal to an inner circumferential cross-sectional area of the elastic member 30 and may thus be inserted into the elastic member 30, and the first body portion 120 may have a cross-sectional area greater than the inner circumferential cross-sectional area of the elastic member 30 such that one end of the elastic member 30 may be supported by the first body portion 120. In addition, the third body portion 140 may have a cross-sectional area greater than the inner circumferential cross-sectional area of the elastic member 30 such that the third body portion 140 may be inserted between a gap (s) between a circular turn and the next circular turn connected to the circular turn. Owing to this, the probe member 10 and the elastic member 30 may be coupled to each other without using an additional coupling member. In this case, the thickness of the third body portion 140 may be less than or equal to the gap (s) between the circular turn and the next circular turn connected to the circular turn.

Figure 9:
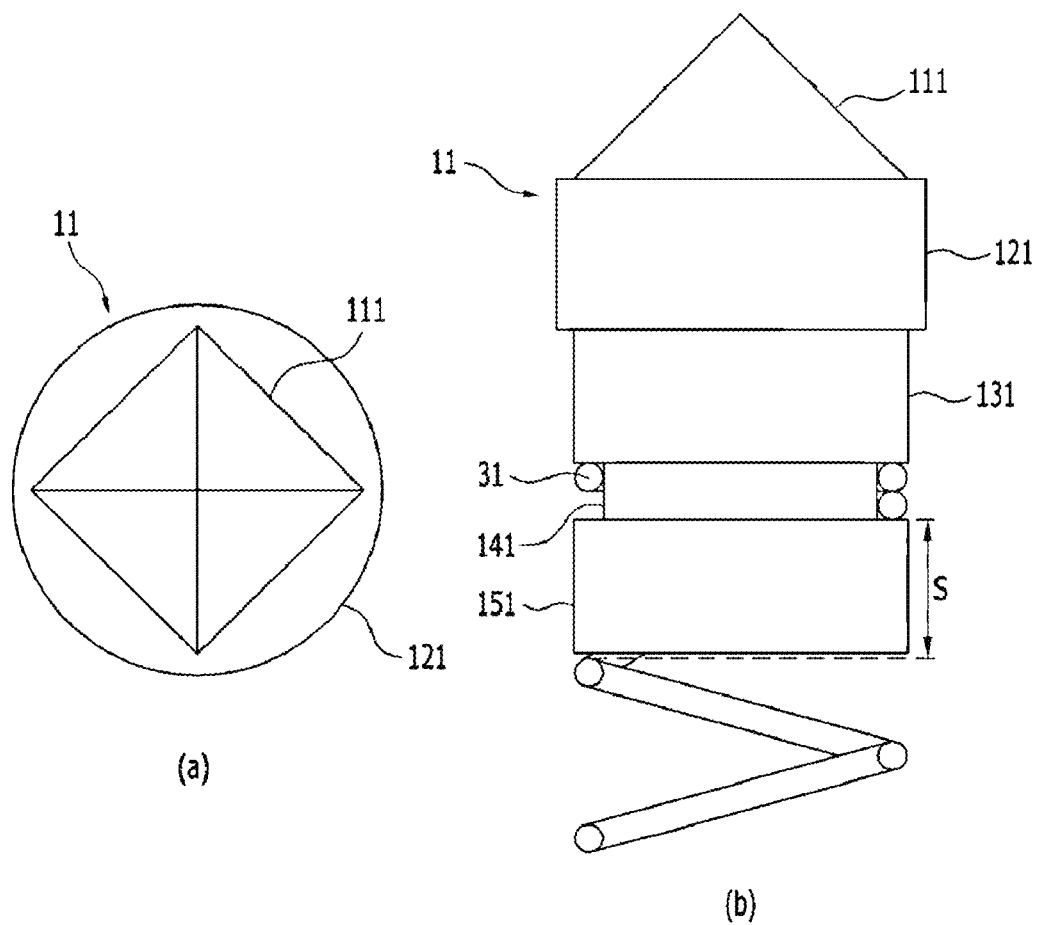
FIG. 9 illustrates a front view and a cross-sectional view of the probe member for a pogo pin of the second embodiment of the present invention, the probe member being connected to an elastic member.

FIG. 9 illustrates a front view and a cross-sectional view of the probe member 11 coupled to an elastic member 31 according to the second embodiment of the present invention. FIG. 9(a) illustrates the front view of the probe member 11.

In the probe member 11 of the second embodiment of the present invention, one contact portion 111 is coupled to the one end of the first body portion 121. In this case, the contact portion 111 may have a cross-sectional area less than the cross-sectional area of the first body portion 121 such that the contact portion 111 may be completely supported by the first body portion 121.

FIG. 9(b) illustrates the cross-sectional view of the probe member 11. The third body portion 141 may have a cross-sectional area less than or equal to an inner circumferential cross-sectional area of the elastic member 31 and may thus be inserted into the elastic member 31, and the second body portion 131 may have a cross-sectional area greater than the inner circumferential cross-sectional area of the elastic member 31 such that one end of the elastic member 31 may be supported by the second body portion 131. In addition, the fourth body portion 151 may have a cross-sectional area greater than the inner circumferential cross-sectional area of the elastic member 31 such that the fourth body portion 151 may be inserted between a gap (s) between a circular turn and the next circular turn connected to the circular turn. Owing to this, the probe member 11 and the elastic member 31 may be coupled to each other without using an additional coupling member. In this case, the thickness of the fourth body portion 151 may be less than or equal to the gap (s) between the circular turn and the next circular turn connected to the circular turn.

As described above, in the probe members 10 and 11, the body portions may have different cross-sectional areas to easily form a multi-step structure, and thus the probe members 10 and 11 may be easily coupled to the elastic members 30 and 31.

FIG. 10 illustrates operational views of the pogo pin 1 including the probe member 10 according to the first embodiment of the present invention.

First, as illustrated in FIG. 10(a), the terminal (b) of the semiconductor device B is placed at a position corresponding to the pogo pin 1, and then as illustrated in FIG. 10(b), the semiconductor device B is lowered or the pogo pin 1 is lifted to bring the terminal (b) of the semiconductor device B into contact with the contact portions 110 of the probe member 10.

According to the present invention, the shapes, positions, and heights of the plurality of contact portions 110 of the probe member 10 can be freely selected according to the purpose of a designer, and thus an optimal contact type suitable for the terminal (b) of the semiconductor device B may be provided.

Figure 11:
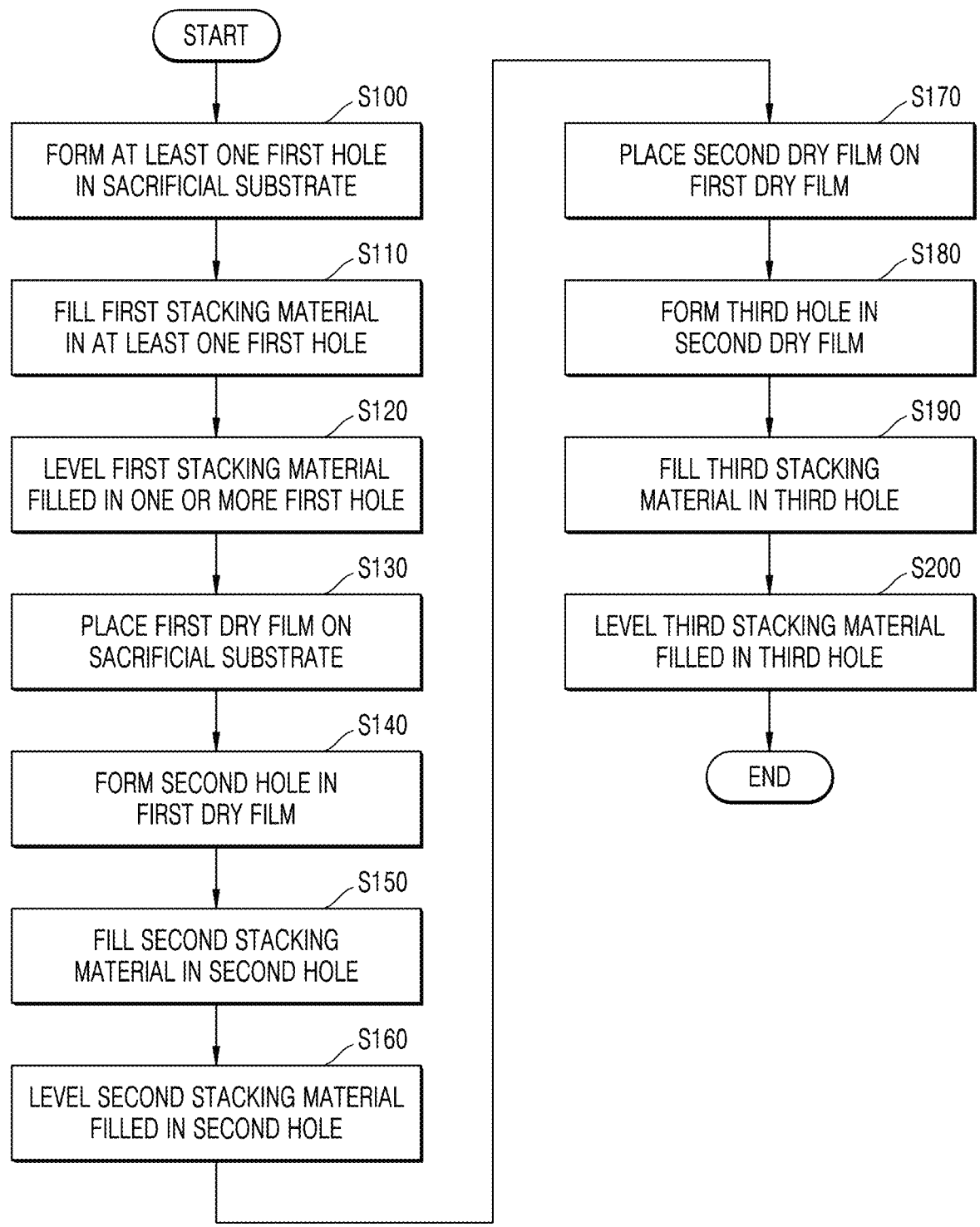
FIG. 11 is a flowchart illustrating a method of manufacturing a probe member for a pogo pin, according to an embodiment of the present invention.

FIG. 11 is a flowchart illustrating a method of manufacturing a probe member according to an embodiment of the present invention. According to the embodiment of the present invention, the method of manufacturing a probe member includes: a process S100 of forming at least one first hole in a sacrificial substrate; a process S110 of filling a first stacking material in the first hole; a process S120 of leveling the first stacking material filled in the first hole; a process S130 of placing a first dry film on an upper surface of the sacrificial substrate; a process S140 of forming a second hole in the first dry film to expose the first stacking material; a process S150 of filling a second stacking material in the second hole; a process S160 of leveling the second stacking material filled in the second hole; a process S170 of placing a second dry film on an upper surface of the first dry film; a process S180 of forming a third hole in the second dry film to expose at least a portion of the second stacking material; a process S190 of filling a third stacking material in the third hole; and a process S200 of leveling the third stacking material filling in the third hole, thereby manufacturing a probe member including a contact portion, a first body portion, and a second body portion through the processes. Thereafter, the manufacture of the probe member may be completed by removing all the dry films and separating the probe member from the sacrificial substrate. Like this, the probe member of the present invention may be manufactured through micro electro mechanical system (MEMS) processes.

The process S100 of forming the at least one first hole in the sacrificial substrate to the process S120 of leveling the first stacking material filled in the first hole may be for forming the contact portion of the probe member, the process S130 of placing the first dry film on the upper surface of the sacrificial substrate to the process S160 of leveling the second stacking material filled in the second hole may be for forming the first body portion of the probe member, the process S170 of placing the second dry film on the first dry film to the process S200 of leveling the third stacking material filling in the third hole may be for forming the second body portion.

In an embodiment of the present invention, an additional body portion may be formed through processes of placing a dry film, forming a hole, filling a stacking material in the hole, and leveling the stacking material as described above. That is, the number of sequentially stacked body portions may vary with user's designs.

According to an embodiment of the present invention, prior to the process S110 of filling the first stacking material in the first hole, the method may further include a process of forming a conductive layer on the upper surface of the sacrificial substrate in which the first hole is formed. In this case, the conductive layer may increase the electrical conductivity of the probe member.

According to an embodiment of the present invention, prior to the process S130 of placing the first dry film on the sacrificial substrate, the method may further include a process of forming a conductive layer on the upper surface of the sacrificial substrate. In the case, the conductive layer may increase the electrical conductivity of the probe member.

In addition, according to the characteristics of the first dry film (a negative or positive film), the process S140 of forming the second hole may be performed by exposing, to light, a region in which the second hole will be formed or a region in which the second hole will not be formed. In this case, the second hole has the same shape as the first body portion to be formed.

According to an embodiment of the present invention, prior to the process S170 of placing the second dry film on the first dry film, the method may further include a process of forming a conductive layer on the upper surface of the first dry film. In the case, the conductive layer may increase the electrical conductivity of the probe member. In addition, according to the characteristics of the second dry film (a negative or positive film), the process S140 of forming the third hole may be performed by exposing, to light, a region in which the third hole will be formed or a region in which the third hole will not be formed. In this case, the third hole has the same shape as the second body portion to be formed.

The probe member may be manufactured through MEMS processes to have a multi-step structure, and owing to the multi-step structure, the probe member may easily be coupled to a pipe or an elastic member. After the contact portion and the plurality of body portions are formed through the above-described processes, the manufacture of the probe member may be completed by removing all the dry films and separating the probe member from the sacrificial substrate.

Figure 12:
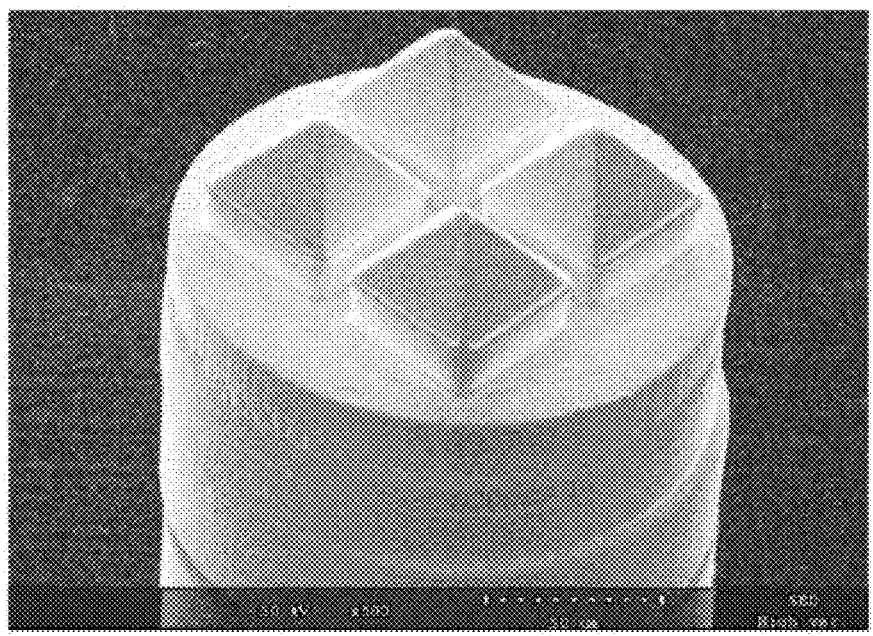
FIG. 12 is a scanning electron microscope (SEM) image showing a portion of the probe member for a pogo pin, according to the first embodiment of the present invention.

FIG. 12 is a scanning electron microscope (SEM) image showing a portion of a probe member of the first embodiment of the present invention. Referring to the image, four contact portions having a quadrangular pyramid shape are formed in one-end regions, and body portions supporting the contact portions are stacked on the other ends of the contact portions.

Figure 13:
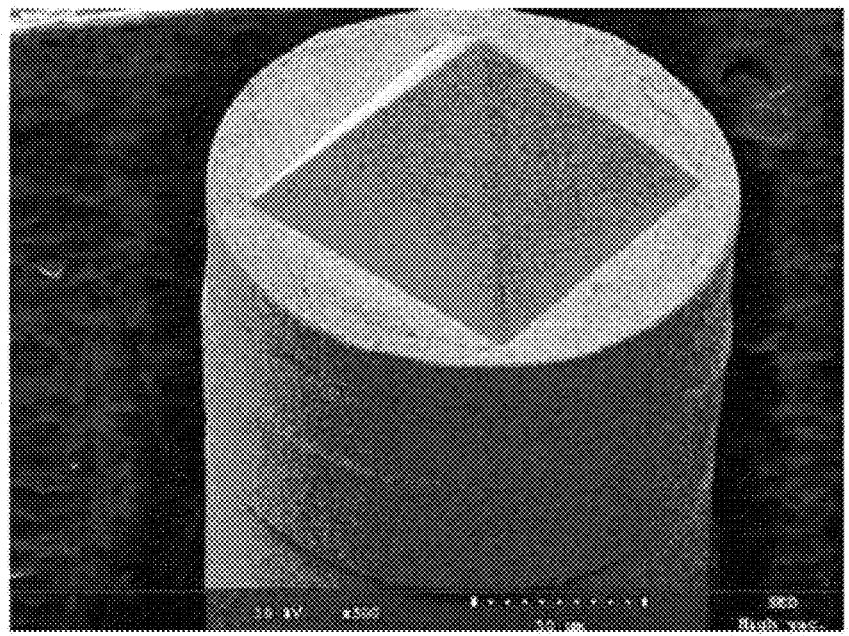
FIG. 13 is an SEM image showing a portion of the probe member for a pogo pin, according to the second embodiment of the present invention.

FIG. 13 is an SEM image showing a portion of a probe member of the second embodiment of the present invention. Referring to the image, a contact portion having a quadrangular pyramid shape is formed, and body portions supporting the contact portion are stacked on the other end of the contact portion.

In a probe member according to the present invention, a contact portion and a body portion coupled to the other end of the contact portion may include different materials. In this case, the contact portion may include a high-hardness material having high wear resistance and thus may not easily wear even after being used many times. Therefore, the probe member may be reliably brought into contact with a terminal even after being used many times.

In addition, the body portion may include a highly conductive material to minimize current loss in the probe member. That is, since the contact portion and the body portion of the probe member includes different materials according to the present invention, the efficiency and lifespan of the probe member may be improved.

The description of the present invention is for illustrative purposes only, and it will be understood by those of ordinary skill in the art that modifications and changes in form may be made without departing from the technical ideas and essential features of the present invention.

Therefore, the above-described embodiments should be considered in a descriptive sense only and not for purposes of limitation. For example, each element described above may be provided in a distributed manner, and elements described above as being distributed may be provided in a combined form.

The scope of the present invention is defined by the following claims, and it should be construed that all modifications or changes made within the meaning and scope of the present invention and equivalents thereof are within the scope of the present invention.

The invention claimed is:

1. A probe member for a pogo pin used in a test socket, the probe member being configured to be at least partially inserted in a pipe having an internal space, the probe member comprising:
    at least one contact portion having a pointed tip on one end and configured to be brought into contact with a terminal of a test-target object; a first body portion having a polygonal or circular pillar shape, the other end of the at least one contact portion being coupled to one end of the first body portion;
    a second body portion having a polygonal or circular pillar shape, the other end of the first body portion being coupled to one end of the second body portion,
    wherein the first body portion and the second body portion are stacked in a height direction based on the other end of the at least one contact portion;
    a third body portion having a polygonal or circular pillar shape, the other end of the second body portion being coupled to one end of the third body portion; and
    a fourth body portion having a polygonal or circular pillar shape, the other end of the third body portion being coupled to one end of the fourth body portion;
    wherein the third body portion has an outer diameter less than respective outer diameters of the second and fourth body portions, such that a recessed portion of the pipe is fixed to at least a portion of an outer peripheral surface of the third body portion or such that an elastic member in the internal space of the pipe is fixed to at least a portion of the third body portion.

2. The probe member of claim 1, wherein the at least one contact portion has a cross-sectional area which gradually increases or is constant in a direction from the one end toward the other end of the at least one contact portion.

3. The probe member of claim 2, wherein the at least one contact portion is two or more in number, and at least one of the two or more contact portions has a height different from that of the other contact portions.

4. The probe member of claim 1, wherein the at least one contact portion has a quadrangular pyramid shape, and lateral surfaces of the quadrangular pyramid shape each have an equilateral triangle shape with an apex angle of 50° to 90°.

5. The probe member of claim 1, wherein the at least one contact portion has a height of 650 μm or less.

6. The probe member of claim 1, wherein the at least one contact portion is two or more in number, and a distance between adjacent contact portions is 15 μm or greater.

7. A pogo pin configured to be brought into contact with a terminal of a semiconductor device for inspecting electrical characteristics of the semiconductor device, the pogo pin comprising:

the probe member of claim 1;

a pipe in which an internal space is formed to accommodate a portion of the probe member; a plunger having a portion inserted in the internal space and another portion protruding outward from the pipe; and an elastic member having one end coupled to the probe member to bias the probe member toward an outside of the pipe, and having the other end coupled to the plunger.

8. A method of manufacturing a probe member for a pogo pin used in a test socket, the probe member being configured to be at least partially inserted in a pipe having an internal space, the method comprising:

forming, in a sacrificial substrate, at least one first hole having a pointed tip on one end;

forming a contact portion by filling a first stacking material in the at least one first hole and leveling the first stacking material;

placing a first dry film on an upper surface of the sacrificial substrate and forming, in the first dry film, a second hole having a polygonal or circular pillar shape to expose the contact portion;

forming a first body portion by filling a second stacking material in the second hole and leveling the second stacking material;

placing a second dry film on an upper surface of the first dry film and forming, in the second dry film, a third hole having a polygonal or circular pillar shape to expose a least a portion of the first body portion; and forming a second body portion by filling a third stacking material in the third hole and leveling the third stacking material, wherein the first and second dry films are stacked in a height direction based on the upper surface of the sacrificial substrate in which the at least one first hole is formed.

9. The method of claim 8, further comprising:

placing a third dry film on an upper surface of the second dry film and forming, in the third dry film, a fourth hole having a polygonal or circular pillar shape to expose the second body portion; and forming a third body portion by filling a fourth stacking material in the fourth hole and leveling the fourth stacking material.

10. The method of claim 9, wherein the third hole has an area less than respective areas of the second hole and the fourth hole.

11. The method of claim 9, further comprising:

placing a fourth dry film on an upper surface of the third dry film and forming, in the fourth dry film, a fifth hole having a polygonal or circular pillar shape to expose the third body portion; and forming a fourth body portion by filling a fifth stacking material in the fifth hole and leveling the fifth stacking material.

12. The method of claim 11, wherein the fourth hole has an area less than respective areas of the third hole and the fifth hole.

13. The method of claim 8, wherein the at least one first hole has a quadrangular pyramid shape, and lateral surfaces of the quadrangular pyramid shape each have an equilateral triangle shape with an apex angle of 50° to 90°.

* * * * *